US012757585B2

(12) United States Patent
Huo et al.

(10) Patent No.: US 12,757,585 B2
(45) Date of Patent: Oct. 6, 2026

(54) DISPLAY PANEL, VEHICLE-MOUNTED DISPLAY DEVICE AND METHOD FOR MANUFACTURING DISPLAY PANEL

(71) Applicants: Chengdu BOE Optoelectronics Technology Co., Ltd., Chengdu (CN); BOE Technology Group Co., Ltd., Beijing (CN)

(72) Inventors: Baolei Huo, Beijing (CN); Yang Wang, Beijing (CN); Qiang Zhou, Beijing (CN); Feifei Gao, Beijing (CN); Hanxiao Zhang, Beijing (CN); Yonghua Li, Beijing (CN); Guoqiang Tang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/697,999

(22) PCT Filed: Jul. 31, 2023

(86) PCT No.: PCT/CN2023/110128
§ 371 (c)(1),
(2) Date: Apr. 2, 2024

(87) PCT Pub. No.: WO2024/045979
PCT Pub. Date: Mar. 7, 2024

(65) Prior Publication Data
US 2025/0234709 A1 Jul. 17, 2025

(30) Foreign Application Priority Data
Aug. 30, 2022 (CN) ........................ 202211048046.1

(51) Int. Cl.
*H10K 59/122* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/80521* (2023.02)

(58) Field of Classification Search
CPC ............. H10K 59/122; H10K 59/1201; H10K 59/80521; H10W 42/00
See application file for complete search history.

(56) References Cited

U.S. PATENT DOCUMENTS

2019/0237524 A1 8/2019 Chen et al.
2020/0280024 A1* 9/2020 Bai ...................... H10K 59/874

FOREIGN PATENT DOCUMENTS

CN 101340753 A 1/2009
CN 107256882 A 10/2017
(Continued)

OTHER PUBLICATIONS

CN202211048046.1 First office action dated Jun. 3, 2026.

*Primary Examiner* — Leonardo Andujar
(74) *Attorney, Agent, or Firm* — IPro, PLLC

(57) ABSTRACT

Provided is a display panel. The display panel includes a substrate, a display structure and a package structure, wherein the display structure is disposed on the substrate, the package structure is packaged on a side, away from the substrate, of the display structure, the display structure includes a pixel definition layer, a light-emitting layer and a patterned cathode layer, the pixel definition layer is disposed on the substrate, a light-emitting region opening is disposed on the pixel definition layer, a portion of the light-emitting layer is disposed in the light-emitting region opening, the patterned cathode layer is disposed on the pixel definition layer and the light-emitting layer, the patterned cathode
(Continued)

layer has a cathode patterned notch; and the package structure includes a first package layer packaged on the display structure, and thickness uniformity of the first package layer is greater than or equal to 60%.

20 Claims, 6 Drawing Sheets

(56) References Cited

FOREIGN PATENT DOCUMENTS

| | | | |
|---|---|---|---|
| CN | 107863447 | A | 3/2018 |
| CN | 109216574 | A | 1/2019 |
| CN | 113571664 | A | 10/2021 |
| CN | 113594215 | A | 11/2021 |
| CN | 113629205 | A | 11/2021 |
| CN | 114583085 | A | 6/2022 |
| CN | 115377324 | A | 11/2022 |
| KR | 101705564 | B1 | 2/2017 |

* cited by examiner

DISPLAY PANEL, VEHICLE-MOUNTED DISPLAY DEVICE AND METHOD FOR MANUFACTURING DISPLAY PANEL

CROSS-REFERENCE TO RELATED APPLICATION

This application is a U.S. national phase application based on PCT/CN2023/110128, filed on Jul. 31, 2023, which claims priority to Chinese patent Application No. 202211048046.1, filed on Aug. 30, 2022, the contents of which are incorporated herein by reference in their entireties.

TECHNICAL FIELD

The present disclosure relates to the field of display technologies, in particular to a display panel, a vehicle-mounted display device and a method for manufacturing a display panel.

BACKGROUND

In the existing organic light-emitting diode (OLED) display device, the cathode layer is a whole layer covering an organic electroluminescence (EL) layer and a pixel definition layer (PDL).

SUMMARY

Embodiments of the present disclosure provide a display panel. The display panel include a substrate, a display structure and a package structure, wherein the display structure is disposed on the substrate, the package structure is packaged on a side, away from the substrate, of the display structure, characterized in that: the display structure includes a pixel definition layer, a light-emitting layer and a patterned cathode layer, wherein the pixel definition layer is disposed on the substrate, a light-emitting region opening is disposed on the pixel definition layer, a portion of the light-emitting layer is disposed in the light-emitting region opening, the patterned cathode layer is disposed on sides, away from the substrate, of the pixel definition layer and the light-emitting layer, the patterned cathode layer has a cathode patterned notch, and the cathode patterned notch extends through a thickness of the patterned cathode layer and is disposed corresponding to the pixel definition layer; and the package structure includes a first package layer, the first package layer is packaged on a side, away from the substrate, of the display structure, and thickness uniformity of the first package layer is greater than or equal to 60%.

In some embodiments, material particles of the patterned cathode layer protruding toward a side away from the substrate are disposed on a side, away from the substrate, of the pixel definition layer, a morphology of a portion of the first package layer corresponding to the material particles protrudes along with the material particles, the first package layer includes a first top package portion, a first bottom package portion and a first side package portion, the first top package portion corresponds to a side, away from the substrate, of the material particles, the first bottom package portion corresponds to a portion on a side, away from the substrate and without the material particles of the display structure, and the first side package portion corresponds to a side slope surface of the material particles; and the thickness uniformity includes any one or more of a first thickness uniformity, a second thickness uniformity and a third thickness uniformity, wherein the first thickness uniformity is a percentage value of a thickness of the first side package portion to a thickness of the first top package portion, the second thickness uniformity is a percentage value of the thickness of the first side package portion to a thickness of the first bottom package portion, the third thickness uniformity is a percentage value of the thickness of the first top package portion to the thickness of the first bottom package portion, and any one or more of the first thickness uniformity, the second thickness uniformity and the third thickness uniformity is/are greater than or equal to 60%.

In some embodiments, a warpage protruding toward a side away from the substrate and/or sinking toward a side close to the substrate is disposed on an edge, close to the cathode patterned notch, of the patterned cathode layer, a morphology of a portion of the first package layer corresponding to the warpage protrudes and/or sinks along with the warpage, the first package layer includes a second top package portion, a second bottom package portion and a second side package portion, wherein the second top package portion corresponds to a side, away from the substrate, of the warpage, the second bottom package portion corresponds to a portion on a side, away from the substrate and without the warpage, of the display structure, and the second side package portion corresponds to a side slope surface of the warpage; and the thickness uniformity includes any one or more of a third thickness uniformity, a fourth thickness uniformity and a fifth thickness uniformity, wherein the third thickness uniformity is a percentage value of a thickness of the second side package portion to a thickness of the second top package portion, the fourth thickness uniformity is a percentage value of the thickness of the second side package portion to a thickness of the second bottom package portion, the fifth thickness uniformity is a percentage value of the thickness of the second top package portion to the thickness of the second bottom package portion, and any one or more of the third thickness uniformity, the fourth thickness uniformity and the fifth thickness uniformity is greater than or equal to 60%.

In some embodiments, an orthographic projection of the first package layer on the patterned cathode layer is partially overlapped with the cathode patterned notch.

In some embodiments, a cathode patterned layer is disposed in the cathode patterned notch in a side, away from the substrate, of the pixel definition layer, a material of the cathode patterned layer is not adhered to a material of the patterned cathode layer to form the cathode patterned notch, and an orthographic projection of the first package layer on the patterned cathode layer is partially overlapped with the cathode patterned layer.

In some embodiments, a warpage protruding toward a side away from the substrate is disposed on an edge, close to the cathode patterned notch, of the patterned cathode layer, and an orthographic projection of the first package layer on the patterned cathode layer is partially overlapped with the warpage of the patterned cathode layer.

In some embodiments, the display structure further includes a light extraction layer, the light extraction layer is disposed on a side, away from the substrate, of the patterned cathode layer, a morphology of portion of the light extraction layer corresponding to the warpage protrudes and/or sinks along with the warpage, and an orthographic projection of the first package layer on the light extraction layer is partially overlapped with the warpage of the light extraction layer.

In some embodiments, a material of the first package layer includes any one or more of a silicon nitride compound, a silicon oxide compound and an aluminum oxide compound.

In some embodiments, the package structure further includes a second package layer, and the second package layer is stacked with the first packing later and is packaged on a side, away from the substrate, of the display structure.

In some embodiments, the package structure further includes a fill layer, and the fill layer is disposed between the first package layer and the second package layer, and is configured to fill a surface, away from the substrate, of one of the first package layer and the second package layer close to the substrate, such that the surface is flat.

In some embodiments, the package structure further includes a third package layer, wherein the third package layer is packaged on sides, away from the substrate, of the first package layer and the second package layer or sides, close to the substrate, of the first package layer and the second package layer, or is disposed between the first package layer and the second package layer, and the third package layer is stacked with the first package layer and the second package layer.

In some embodiments, the package structure further includes the fill layer, and the fill layer is disposed between any two adjacent layers of the first package layer, the second package layer and the third package layer, and is configured to fill a surface, away from the substrate, of one of the any two adjacent layers close to the substrate, such that the surface is flat.

In some embodiments, the thickness uniformity of the first package layer is greater than or equal to 80%.

In some embodiments, a thickness of the first package layer ranges from 50 nm to 60 nm.

In some embodiments, a thickness of the first package layer ranges from 50 nm to 60 nm.

In some embodiments, a thickness of the first package layer accounts for 39.49% to 47.39% of a total thickness of the first package layer, the second package layer and the fill layer.

In some embodiments, a thickness of the first package layer accounts for 36.60% to 43.92% of a total thickness of the first package layer, the second package layer, the third package layer and the fill layer.

In some embodiments, failure time of the display panel is at least 240 hours in the case that a temperature is 85° C. and a humidity is 85%.

In some embodiments, the failure time of the display panel is at least 600 hours in the case that a temperature is 85° C. and a humidity is 85%.

Embodiments of the present disclosure further provide a vehicle-mounted display device, and the vehicle-mounted display device includes the display panel according to the present disclosure.

Embodiments of the present disclosure further provide a method for manufacturing a display panel, applicable to manufacturing the display panel according to the present disclosure, the method including:

- preparing the pixel definition layer with the light-emitting region opening on the substrate;
- preparing the light-emitting layer in the light-emitting region opening;
- forming the display structure by preparing the patterned cathode layer with the cathode patterned notch on the sides, away from the substrate, of the pixel definition layer and the light-emitting layer, wherein the cathode patterned notch extends through the thickness of the patterned cathode layer and is disposed corresponding to the pixel definition layer; and
- forming the package structure by package the first package layer on a side, away from the substrate, of the display structure by an atomic layer deposition (ALD) process, with the thickness uniformity of the first package layer greater than or equal to 60%.

DETAILED DESCRIPTION

Figure 1:
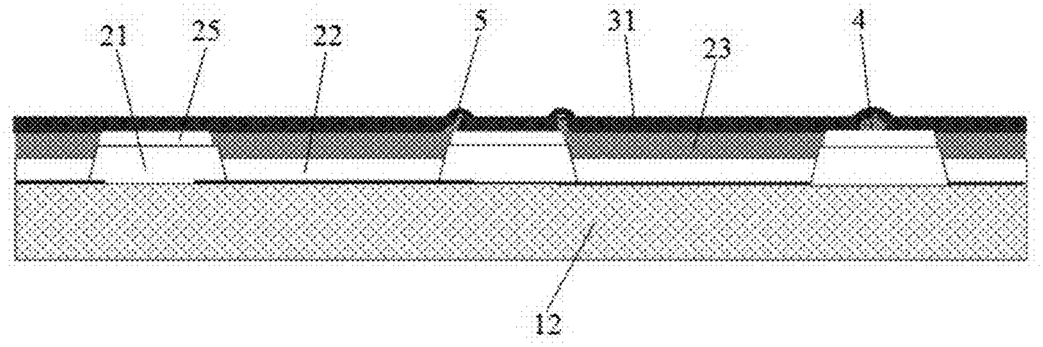
FIG. 1 is a schematic structural diagram of a display panel according to some embodiments of the present disclosure.

In order to make those skilled in the art better understand the technical modes of the present disclosure, the display panel, the vehicle-mounted display device and the method for manufacturing a display panel according to the present disclosure will be described in detail in combination with the accompanying drawings.

In some practices, the material of the cathode layer is typically an Mg—Ag alloy with better electrical conductivity. However, due to a lower transmittance of the Mg—Ag alloy, a transmittance of the cathode layer is lower, resulting in poorer or even difficult-to-achieve effects of technologies such as full display with camera (FDC), full display payment, full display unlocking and transparent display.

As shown in FIG. 1 to FIG. 12, some embodiments of the present disclosure provide a display panel, including a substrate 1, a display structure 2 and a package structure. The display structure 2 is disposed on the substrate 1, and the package structure is packaged on a side, away from the substrate 1, of the display structure 2. The display structure 2 includes a pixel definition layer 21, a light-emitting layer 22 and a patterned cathode layer 23. The pixel definition layer 21 is disposed on the substrate 1, and a light-emitting region opening is disposed on the pixel definition layer 21. The light-emitting layer 22 is disposed in the light-emitting region opening, and the patterned cathode layer 23 is disposed on the sides, away from the substrate 1, of the pixel definition layer 21 and the light-emitting layer 22. The patterned cathode layer 23 has a cathode patterned notch 24, the cathode patterned notch 24 extends through a thickness of the patterned cathode layer 23 and is disposed corresponding to the pixel definition layer 21. The package structure includes a first package layer 31, the first package layer 31 is packaged on a side, away from the substrate 1, of the display structure 2, and thickness uniformity of the first package layer 31 is greater than or equal to 60%.

For the display panel according to the present disclosure, the patterned cathode layer 23 is disposed on the sides, away from the substrate 1, of the pixel definition layer 21 and the light-emitting layer 22 in the display structure 2, and the patterned cathode layer 23 has the cathode patterned notch 24 penetrating the thickness of the patterned cathode layer 23 and disposed corresponding to the pixel definition layer 21. Therefore, compared with the prior art that the cathode layer is a whole layer covering the electroluminescence layer 22 and the pixel definition layer 21, a non-light-emitting region where the pixel definition layer 21 is disposed is not provided with the cathode layer, such that the transmittance of the display panel can be improved. Moreover, by disposing the first package layer 31 in the package structure on a side, away from the substrate 1, of the display structure 2, because the thickness uniformity of the first package layer 31 is greater than or equal to 60%, thinner portions of the first package layer 31 which are easy for water and oxygen to extends through can be reduced, such that the capability of preventing entrance of the water and oxygen of the package structure can be improved, the package reliability of the display panel can be improved, and the product yield is improved.

Specifically, the region where the pixel definition layer (PDL) 21 is disposed in the display structure 2 is called a non-light-emitting region, and the region where the light-emitting layer 22 is disposed is called a light-emitting region. In the prior art, the whole cathode layer covers the sides, away from the substrate 1, of the pixel definition layer 21 and the light-emitting layer 22, that is, in the prior art, the cathode layer is a whole layer covering a side, away from the substrate 1, of the pixel definition layer 21 and a side, away from the substrate 1, of the light-emitting layer 22, that is, in the prior art, the sides, away from the substrate 1, of the pixel definition layer 21 and the light-emitting layer 22 are both covered the cathode layer. In some embodiments of the present disclosure, the patterned cathode layer 23 is disposed on the sides, away from the substrate 1, of the pixel definition layer 21 and the light-emitting layer 22, the patterned cathode layer 23 has the cathode patterned notch 24, and the cathode patterned notch 24 extends through the thickness of the patterned cathode layer 23 and is disposed corresponding to the pixel definition layer 21, such that the cathode material is not present in the region, corresponding to the cathode patterned notch 24, of a side, away from the substrate 1, of the pixel definition layer 21. That is, the patterned cathode layer 23 covers a side, away from the substrate 1, of the light-emitting layer 22, but does not covers a side, away from the substrate 1, of the pixel definition layer 21. That is, in the embodiments of the present disclosure, the patterned cathode layer 23 covers the light-emitting region instead of the non-light-emitting region. Therefore, compared with the prior art, the transmittance of the display panel can be improved, for example, the transmittance of visible light and infrared bands can be improved.

In some embodiments, the display panel includes an OLED display panel.

In some embodiments, the display structure 2 includes an OLED display structure 2.

In some embodiments, the light-emitting layer 22 includes an EL layer.

In some embodiments of the present disclosure, preparing the patterned cathode layer 23 with the cathode patterned notch 24 on the sides, away from the substrate 1, of the pixel definition layer 21 and the light-emitting layer 22 includes the following processes.

Firstly, a cathode patterned layer 25 is prepared on a side, away from the substrate 1, of the pixel definition layer 21, and a material of the cathode patterned layer 25 is not adhered to a material of the cathode layer. Then a cathode layer is prepared on the sides, away from the substrate 1, of the pixel definition layer 21 and the light-emitting layer 22 to form the patterned cathode layer 23 with the cathode patterned notch 24.

Figure 8:
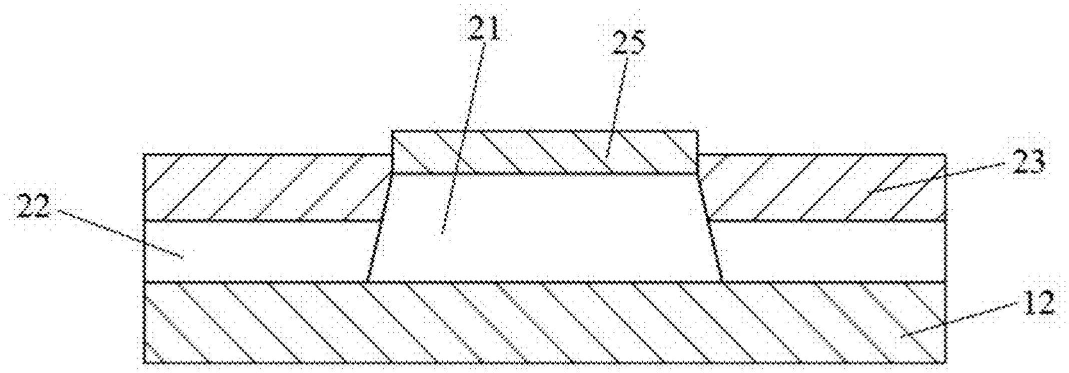
FIG. 8 is a schematic structural diagram of a substrate and a display structure of a display panel according to some embodiments of the present disclosure.
Figure 9:
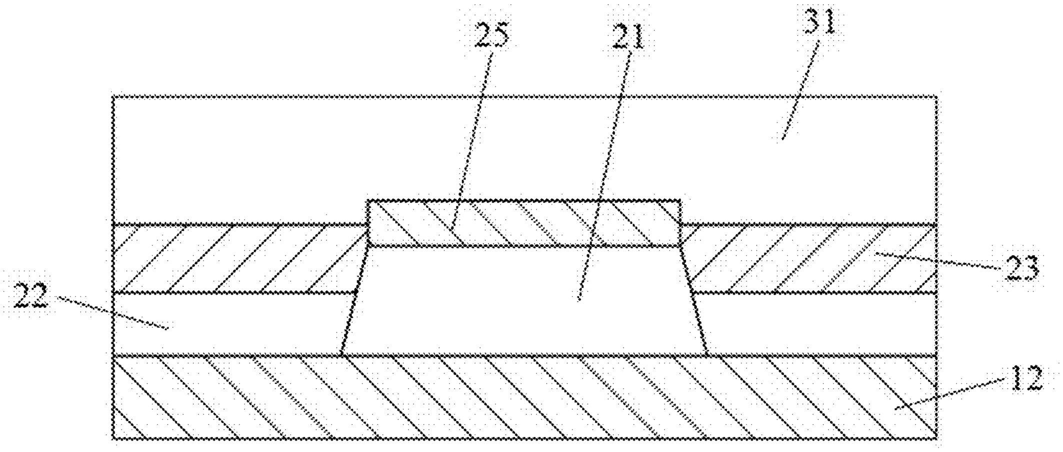
FIG. 9 is a schematic structural diagram of a first package layer packaged on a side, away from the substrate, of the display structure of FIG. 8.

As shown in FIG. 8 and FIG. 9, by preparing the cathode patterned layer 25 on a side, away from the substrate 1, of the pixel definition layer 21, the cathode patterning material (CPM) of the cathode patterned layer 25 is not adhered to the material of the cathode layer. Therefore, in the case that the cathode layer is prepared on the sides, away from the substrate 1, of the pixel definition layer 21 and the light-emitting layer 22 later, the material of the cathode layer is not adhered to the cathode patterned layer 25, such that the cathode layer is not formed on a side, away from the substrate 1, of the pixel definition layer 21 and can be formed on a side, away from the substrate 1, of the light-emitting layer 22, thereby realizing patterning of the cathode layer. The cathode patterned notch 24 is formed at the position corresponding to the pixel definition layer 21, and further the patterned cathode layer 23 is formed. Although the cathode patterned layer 25 is disposed in the cathode patterned notch 24, the material of the cathode patterned layer 25 has higher transmittance, and the transmittance of the cathode patterned layer 25 is higher.

In some embodiments, a material of the patterned cathode layer 23 includes an Mg—Ag alloy.

In some embodiments, the material of the cathode patterned layer 25 includes an F-containing organic matter.

In some embodiments, a preparation process of the cathode patterned layer 25 includes evaporation.

However, the manner of preparing the patterned cathode layer 23 with the cathode patterned notch 24 on the sides, away from the substrate 1, of the pixel definition layer 21 and the light-emitting layer 22 is not limited thereto. For example, in some embodiments of the present disclosure, preparing the patterned cathode layer 23 with the cathode patterned notch 24 on the sides, away from the substrate 1, of the pixel definition layer 21 and the light-emitting layer 22 also includes the following processes.

Firstly, the cathode layer is prepared on the sides, away from the substrate 1, of the pixel definition layer 21 and the light-emitting layer 22. Then an opening penetrating the thickness of the cathode layer is formed at the position of the cathode layer corresponding to the pixel definition layer 21 to form the patterned cathode layer 23 with the cathode patterned notch 24.

Figure 10:
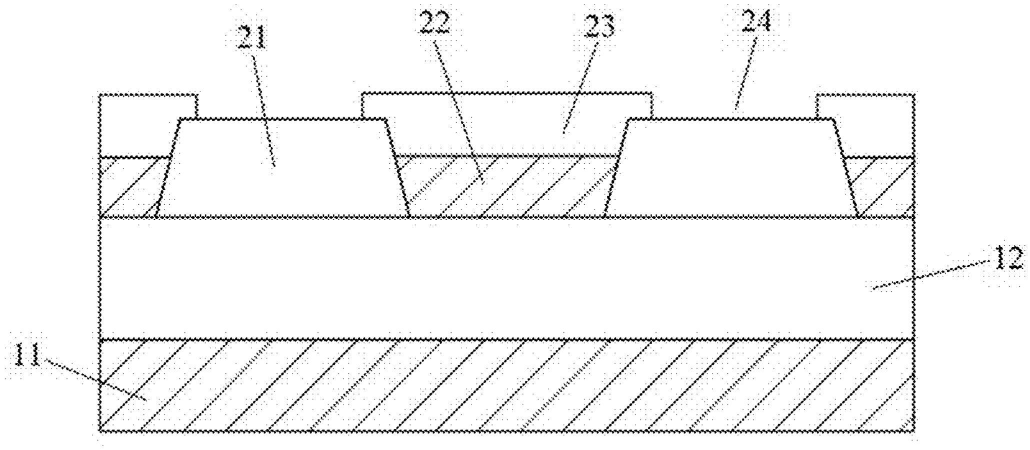
FIG. 10 is another schematic structural diagram of a substrate and a display structure of a display panel according to some embodiments of the present disclosure.
Figure 11:
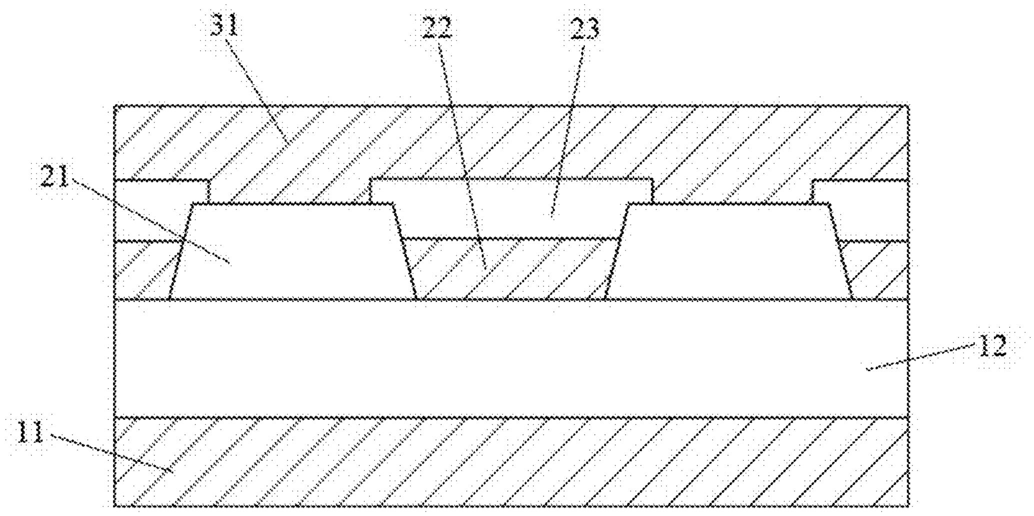
FIG. 11 is a schematic structural diagram of a first package layer packaged on a side, away from the substrate, of the display structure of FIG. 10.

As shown in FIG. 10 and FIG. 11, compared with preparing the cathode patterned layer 25 on a side, away from the substrate 1, of the pixel definition layer 21, and then preparing the cathode layer on the sides, away from the substrate 1, of the pixel definition layer 21 and the light-emitting layer 22 to form the patterned cathode layer 23 with the cathode patterned notch 24, it is unnecessary to prepare the cathode patterned layer 25 on a side, away from the substrate 1, of the pixel definition layer 21. Instead, one whole cathode layer is prepared on the sides, away from the substrate 1, of the pixel definition layer 21 and the light-emitting layer 22, then an opening is formed at the position of the whole cathode layer corresponding to the pixel definition layer 21, and the opening is formed to extends through the thickness of the cathode layer, such that the patterning of the cathode layer can be realized, and the cathode patterned notch 24 is formed at the position corresponding to the pixel definition layer 21, thereby forming the patterned cathode layer 23.

In some embodiments, the process of forming the opening penetrating the thickness of the cathode layer includes vacuum laser.

However, the manner of preparing the patterned cathode layer 23 with the cathode patterned notch 24 on the sides, away from the substrate 1, of the pixel definition layer 21 and the light-emitting layer 22 is not limited to the above two manners.

Figure 2:
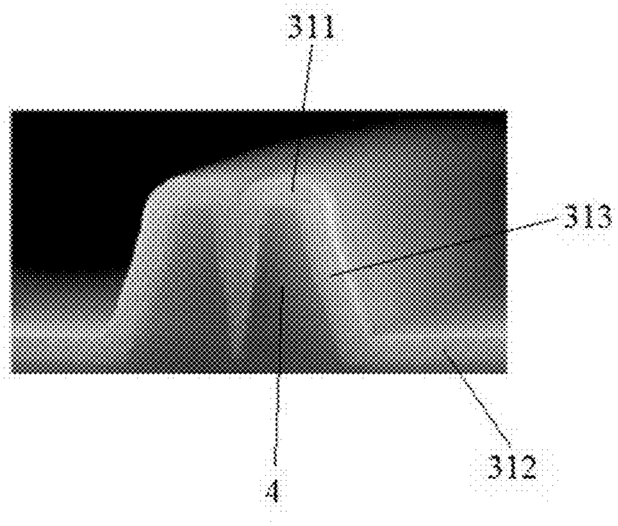
FIG. 2 is a micrograph of a first top package portion, a first bottom package portion and a first side package portion of a first package layer of a display panel according to some embodiments of the present disclosure.

As shown in FIG. 1 and FIG. 2, in practical application, whether the patterned cathode layer 23 is prepared by the cathode patterned layer 25 or the patterned cathode layer 23 is prepared by forming the opening in the cathode layer, it is possible that upon the process of preparing the patterned cathode layer 23, the material particles 4 of the cathode are disposed on a side, away from the substrate 1, of the pixel definition layer 21 and protrude towards a side away from the substrate 1. For example, upon the process of preparing the patterned cathode layer 23 through the cathode patterned layer 25, the material particles 4 of the cathode are disposed on a side, away from the substrate 1, of the cathode patterned layer 25 on a side of the pixel definition layer 21 and protrude toward a side away from the substrate 1, and upon the process of preparing the patterned cathode layer 23 by forming the opening in the cathode layer, the material particles 4 of the cathode are dispose in the cathode patterned notch 24 on a side, away from the substrate 1, of the pixel definition layer 21 and protrude toward a side away from the substrate 1.

Figure 3:
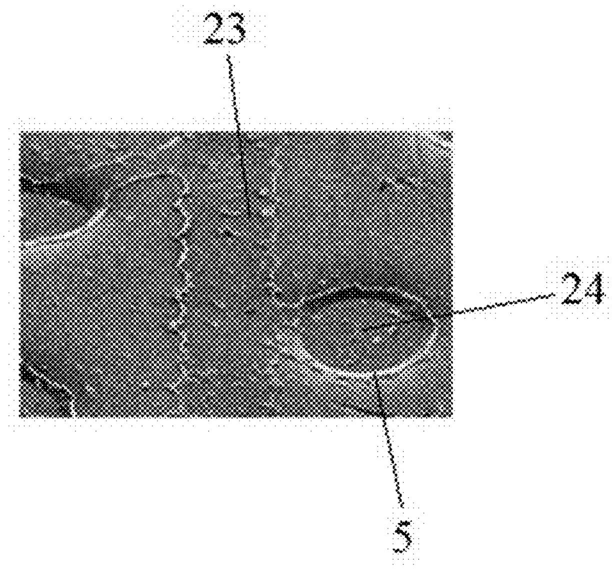
FIG. 3 is a micrograph of an edge, close to a cathode patterned notch and having a warpage, of a patterned cathode layer of a display panel according to some embodiments of the present disclosure.
Figure 4:
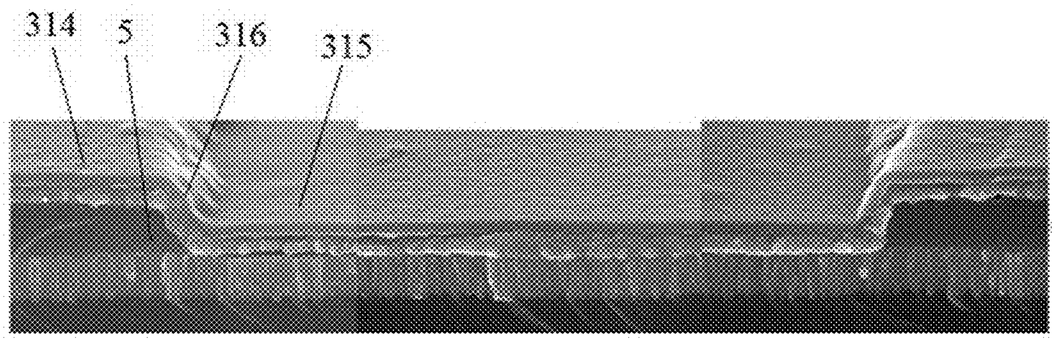
FIG. 4 is a micrograph of a second top package portion, a second bottom package portion and a second side package portion of a first package layer of a display panel according to some embodiments of the present disclosure.

Furthermore, as shown in FIG. 1, FIG. 3 and FIG. 4, in the manner of preparing the patterned cathode layer 23 by forming the opening in the cathode layer with the vacuum laser, in the case that the patterned cathode layer 23 is cut with the vacuum laser, a warpage 5 protruding toward a side away from the substrate 1 and/or sinking toward a side close to the substrate 1 is possibly disposed on the edge, close to the cathode patterned notch 24, of the patterned cathode layer 23. That is, in the case that the patterned cathode layer 23 is cut with the vacuum laser, the warpage 5 protruding toward a side away from the substrate 1 is disposed on the edge, close to the cathode patterned notch 24, of the patterned cathode layer 23, and/or the warpage 5 sinking toward a side close to the substrate 1 is disposed on the edge, close to the cathode patterned notch 24, of the patterned cathode layer 23. The material particles 4 of the cathode and the edge warpage 5 of the patterned cathode layer 23 cause the side, away from the substrate 1, of the display structure 2 to be uneven, which possibly causes the thickness uniformity of the package structure to be poorer in subsequent package of the display structure 2. The package structure has thinner portions which are easy for the water and oxygen to extends through, possibly causing the water and oxygen to enter from the thinner portions of the package structure. Therefore, the reliability of the package structure, the package reliability of the display panel and the product yield are affected.

Figure 12:
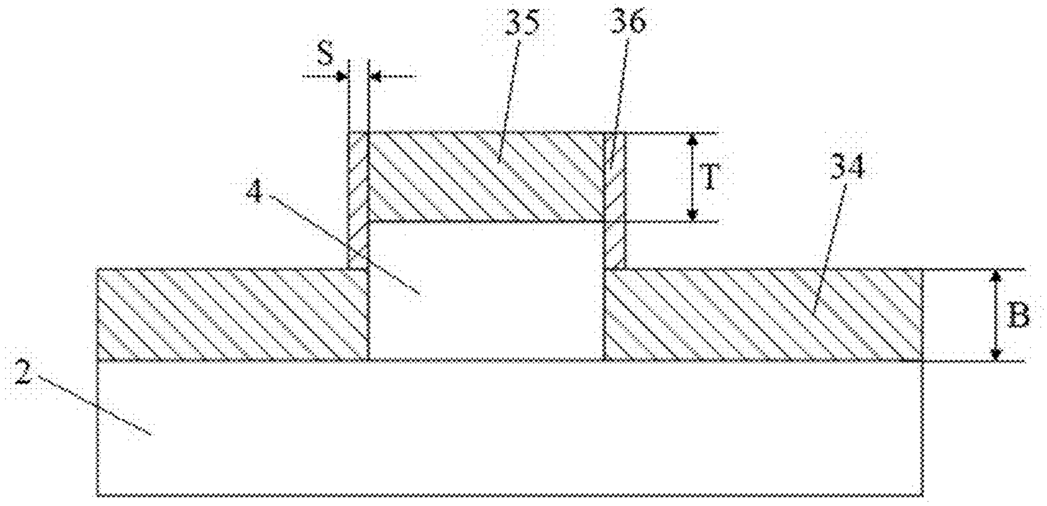
FIG. 12 is a schematic structural diagram of a display structure of a general display panel packed with a package structure that does not include a first package layer on a side, away from a substrate, of the display structure.

As shown in FIG. 12, taking material particles 4 of the cathode protruding toward a side away from the substrate 1 are disposed on a side, away from the substrate 1, of the display structure 2, and the package structure not including the first package layer 31 as an example, the thickness uniformity of the package structure is explained. In the case that the material particles 4 of the cathode protruding toward a side away from the substrate 1 are disposed on a side, away from the substrate 1, of the display structure 2, upon package the display structure 2, the portion of the package structure corresponding to the material particles 4 protrudes along with the material particles 4, causing the package structure to be divided into three portions, namely a bottom package portion 34, a top package portion 35 and a side package portion 36. The top package portion 35 corresponds to a side, away from the substrate 1, of the material particles 4, and the side package portion 36 corresponds to a side slope surface of the material particles 4. The bottom package portion 34 corresponds to the portion of the display structure 2 away from the substrate 1 and without material particles 4. The thickness uniformity of the package structure includes any one or more of a first thickness uniformity, a second thickness uniformity and a third thickness uniformity, wherein the first thickness uniformity is a percentage value of a thickness S of the side package portion 36 to a thickness T of the top package portion 35, that is, the first thickness uniformity is a percentage value of S/T or a percentage value of T/S. The second thickness uniformity is a percentage value of the thickness S of the side package portion 36 to a thickness B of the bottom package portion 34, that is, the second thickness uniformity is a percentage value of S/B or a percentage value of B/S. The third thickness uniformity is a percentage value of the thickness T of the top package portion 35 to the thickness B of the bottom package portion 34, that is, the third thickness uniformity is a percentage value of T/B or a percentage value of B/T. As shown in FIG. 12, in the case that the package structure does not include the first package layer 31, the difference between the thickness S of the side package portion 36 and the thickness B of the bottom package portion 34 is greater, and the difference between the thickness S and the thickness T of the top package portion 35 is greater. In this way, the first thickness uniformity and the second thickness uniformity are poorer, which indicates that the thickness uniformity of the package structure is poorer. However, in the case that the differences between the thickness B of the bottom package portion 34, the thickness T of the top package portion 35 and the thickness S of the side package portion 36 are reduced, the first thickness uniformity, the second thickness uniformity and the third thickness uniformity are improved, thus improving the thickness uniformity of the package structure.

For the display panel according to the embodiment of the present disclosure, the first package layer 31 with the thickness uniformity greater than or equal to 60% is disposed in the package structure on a side, away from the substrate 1, of the display structure 2, and the thickness uniformity of the first package layer 31 is greater than or equal to 60%. Therefore, the thinner portions of the first package layer 31 which are easy for the water and oxygen to extends through can be reduced, such that the capability of preventing entrance of the water and oxygen of the package structure can be improved, and the reliability of the package structure, the package reliability of the display panel and the product yield can be improved.

In some embodiments of the present disclosure, the thickness uniformity of the first package layer 31 is greater than or equal to 80%. In this way, the thinner portions of the first package layer 31 which are easy for the water and oxygen to extends through can be further reduced, thus further improving the capability of preventing entrance of the water and oxygen of the package structure, improving the reliability of the package structure, improving the package reliability of the display panel, and improving the product yield.

As shown in FIG. 1 and FIG. 2, in some embodiments of the present disclosure, the material particles 4 of the patterned cathode layer 23 protruding toward a side away from the substrate 1 are disposed on a side, away from the substrate 1, of the pixel definition layer 21, and a morphology of portion of the first package layer 31 corresponding to the material particles 4 protrudes along with the material particles 4. The first package layer 31 includes a first top package part, a first bottom package portion and a first side package part. The first top package portion corresponds to a side, away from the substrate 1, of the material particles 4, the first bottom package portion corresponds to the portion on a side of the display structure 2 without material particles 4, and the first side package portion corresponds to the side slope surface of the material particles 4. The thickness uniformity includes any one or more of the first thickness uniformity, the second thickness uniformity and the third thickness uniformity. The first thickness uniformity is a percentage value of a thickness of the first side package portion to a thickness of the first top package portion, the second thickness uniformity is a percentage value of the thickness of the first side package portion to a thickness of the first bottom package portion, and the third thickness uniformity is a percentage value of the thickness of the first top package portion to the thickness of the first bottom package portion. Any one or more of the first thickness uniformity, the second thickness uniformity and the third thickness uniformity is/are greater than or equal to 60%.

For example, in the case that the material particles 4 of the cathode protruding toward a side away from the substrate 1 are disposed on a side, away from the substrate 1, of the cathode patterned layer 25 on a side, away from the substrate 1, of the pixel definition layer 21, or the material particles 4 of the cathode protruding toward a side away from the substrate 1 are disposed in the cathode patterned notch 24 on a side, away from the substrate 1, of the pixel definition layer 21, upon the first package layer 31 being disposed in the package structure on a side, away from the substrate 1, of the display structure 2, the morphology of the portion of the first package layer 31 corresponding to the material particles 4 protrudes along with the material particles 4. That is, the first package layer 31 is uneven, and the morphology of the portion of the first package layer 31 corresponding to the material particles 4 protrudes toward a side away from the substrate 1 along with the material particles 4, such that the first package layer 31 includes the first top package portion corresponding to a side, away from the substrate 1, of the material particles 4, the first bottom package portion corresponding to the portion on a side, away from the substrate 1, of the display structure 2 without material particles 4, and the first side package portion corresponding to the side slope surface of the material particles 4.

In this way, the thickness uniformity of the first package layer 31 includes any one or more of the first thickness uniformity, the second thickness uniformity and the third thickness uniformity, wherein the first thickness uniformity is the percentage value of the thickness of the first side package portion to the thickness of the first top package portion. That is, the first thickness uniformity is a percentage value of the thickness of the first side package portion/the thickness of the first top package portion, or a percentage value of the thickness of the first top package portion/the thickness of the first side package portion. The second thickness uniformity is a percentage value of the thickness of the first side package portion to the thickness of the first bottom package portion. That is, the second thickness uniformity is a percentage value of the thickness of the first side package portion/the thickness of the first bottom package portion, or a percentage value of the thickness of the first bottom package portion/the thickness of the first side package portion. The third thickness uniformity is a percentage value of the thickness of the first top package portion to the thickness of the first bottom package portion. That is, the third thickness uniformity is a percentage value of the thickness of the first top package portion/the thickness of the first bottom package portion, or a percentage value of the thickness of the first bottom package portion/the thickness of the first top package portion. In the case that any one or more of the first thickness uniformity, the second thickness uniformity and the third thickness uniformity is/are greater than or equal to 60%, it can be considered that the thickness uniformity of the first package layer 31 is greater than or equal to 60%.

As shown in FIG. 1, FIG. 3 and FIG. 4, in some embodiments of the present disclosure, the warpage 5 protruding toward a side and/or sinking toward a side close to the substrate 1 is disposed on the edge, close to the cathode patterned notch 24, of the patterned cathode layer 23, and the morphology of the portion of the first package layer 31 corresponding to the warpage 5 protrudes along with the warpage 5 and/or is recessed along with the warpage 5. The first package layer 31 includes a second top package portion, a second bottom package portion and a second side package portion, wherein the second top package portion corresponds to a side, away from the substrate 1, of the warpage 5, the second bottom package portion corresponds to the portion on a side, away from the substrate 1, of the display structure without warpage 5, and the second side package portion corresponds to a side slope surface of the warpage 5. The thickness uniformity includes any one or more of the first thickness uniformity, the second thickness uniformity and the third thickness uniformity, wherein the first thickness uniformity is a percentage value of a thickness of a second side package portion to a thickness of the second top package portion, the second thickness uniformity is a percentage value of the thickness of the second side package portion to a thickness of the second bottom package portion, and the third thickness uniformity is a percentage value of the thickness of the second top package portion to the thickness of the second bottom package portion. Any one or more of the first thickness uniformity, the second thickness uniformity and the third thickness uniformity is/are greater than or equal to 60%.

For example, in the case that the warpage 5 protruding toward a side away from the substrate 1 and/or sinking toward a side close to the substrate 1 is disposed on the edge, close to the cathode patterned notch 24, of the patterned cathode layer 23, upon the first package layer 31 being disposed in the package structure on a side, away from the substrate 1, of the display structure 2, the morphology of the portion of the first package layer 31 corresponding to the warpage 5 protrudes and/or sinks along with the warpage 5. That is, the first package layer 31 is uneven, and the morphology of the portion of the first package layer 31 corresponding to the warpage 5 protrudes toward a side away from the substrate 1 along with the warpage 5 and/or sinks toward a side close to the substrate 1 along with the warpage 5, such that the first package layer 31 includes the second top package portion corresponding to a side, away from the substrate 1, of the warpage 5, the second bottom package portion corresponding to the portion on a side, away from the substrate 1, of the display structure 2 without warpage 5, and the second side package portion corresponds to the side slope surface of the warpage 5.

In this way, the thickness uniformity of the first package layer 31 includes any one or more of a third thickness uniformity, a fourth thickness uniformity and a fifth thickness uniformity, wherein the third thickness uniformity is a percentage value of the thickness of the second side package portion to the thickness of the second top package portion. That is, the third thickness uniformity is a percentage value of the thickness of the second side package portion/the thickness of the second top package portion, or a percentage value of the thickness of the second top package portion/the thickness of the second side package portion, the fourth thickness uniformity is a percentage value of the thickness of the second side package portion to the thickness of the second bottom package portion. That is, the fourth thickness uniformity is a percentage value of the thickness of the second side package portion/the thickness of the second bottom package portion, or a percentage value of the thickness of the second bottom package portion/the thickness of the second side package portion, and the fifth thickness uniformity is a percentage value of the thickness of the second top package portion to the thickness of the second bottom package portion. That is, the fifth thickness uniformity is a percentage value of the thickness of the second top package portion/the thickness of the second bottom package portion, or a percentage value of the thickness of the second bottom package portion/the thickness of the second top package portion. In the case that any one or more of the third thickness uniformity, the fourth thickness uniformity and the fifth thickness uniformity is/are greater than or equal to 60%, it can be considered that the thickness uniformity of the first package layer 31 is greater than or equal to 60%.

As shown in FIG. 1 and FIG. 11, in some embodiments of the present disclosure, an orthographic projection of the first package layer 31 on the patterned cathode layer 23 is overlapped with the cathode patterned notch 24, such that the first package layer 31 can cover the material particles 4 disposed in the cathode patterned notch 24.

In some embodiments of the present disclosure, the cathode patterned layer 25 is disposed in the cathode patterned notch 24 on a side, away from the substrate 1, of the pixel definition layer 21, the material of the cathode patterned layer 25 is not adhered to the material of the patterned cathode layer 23 to form the cathode patterned notch 24, and the orthographic projection of the first package layer 31 on the patterned cathode layer 23 is overlapped with the cathode patterned layer 25, such that the first package layer 31 can cover the material particles 4 on a side, away from the substrate 1, of the cathode patterned layer 25.

In some embodiments of the present disclosure, the warpage 5 protruding toward a side away from the substrate 1 is disposed on the edge, close to the cathode patterned notch 24, of the patterned cathode layer 23, and the orthographic projection of the first package layer 31 on the patterned cathode layer 23 is overlapped with the warpage 5 of the patterned cathode layer 23, such that the first package layer 31 can cover the warpage 5 disposed on the edge, close to the cathode patterned notch 24, of the patterned cathode layer 23.

In some embodiments of the present disclosure, the display structure 2 further includes a light extraction layer (CPL), the light extraction layer is disposed on a side, away from the substrate 1, of the patterned cathode layer 23, a morphology of portion of the light extraction layer corresponding to the warpage 5 protrudes and/or sinks along with the warpage 5, and an orthographic projection of the first package layer 31 on the light extraction layer is overlapped with the warpage 5 of the light extraction layer.

This is because the fact that the light extraction layer disposed on a side, away from the substrate 1, of the patterned cathode layer 23 is not flat, and the morphology of the portion of the light extraction layer corresponding to the warpage 5 protrudes toward a side away from the substrate 1 along with the warpage 5 and/or sinks toward a side close to the substrate 1 along with the warpage 5, which causes the orthogonal projection of the first package layer 31 on the light extraction layer to be overlapped with the warpage 5 of the light extraction layer, such that the first package layer 31 can cover the warpage 5 of the light extraction layer.

In some embodiments of the present disclosure, a material of the first package layer 31 includes any one or more of a silicon nitride compound ($SiN_x$), a silicon oxide compound ($SiO_x$) and an aluminum oxide compound.

In some embodiments, the silicon oxide compound includes silicon dioxide ($SiO_2$).

In some embodiments, the aluminum oxide compound includes aluminum oxide ($Al_2O_3$).

As shown in FIG. 10 and FIG. 11, In some embodiments, the substrate 1 includes a base 11 and a back plane 12 (BP).

In some embodiments, the base 11 includes a glass substrate.

In some embodiments of the present disclosure, the package structure further includes a second package layer 321, which is packaged on a side, away from the substrate 1, of the display structure 2, and is stacked with the first package layer 31.

In this way, the entrance of the water and oxygen can be prevented by the first package layer 31, thereby improving the package reliability and the product yield. Besides, the entrance of the water and oxygen can be further prevented by the second package layer 321 stacked with the first package layer 31, thereby further improving the package reliability and the product yield.

Figure 5:
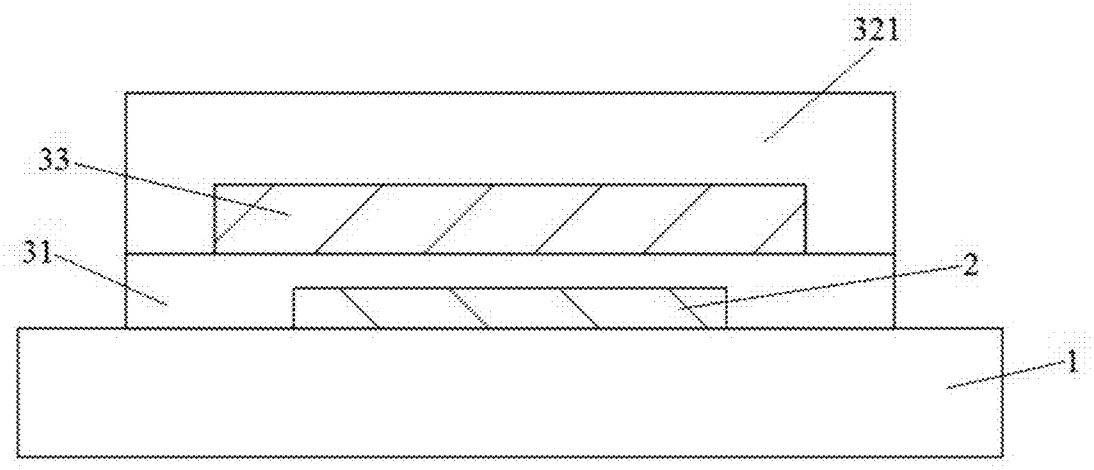
FIG. 5 is another schematic structural diagram of a display panel according to some embodiments of the present disclosure.

For example, as shown in FIG. 5, the first package layer 31 is packaged on a side, away from the substrate 1, of the display structure 2, and the second package layer 321 is stacked on a side, away from the substrate 1, of the first package layer 31.

However, the arrangement of the second package layer 321 and the first package layer 31 is not limited thereto. For example, the second package layer 321 is also packaged on a side, away from the substrate 1, of the display structure 2, and the first package layer 31 is stacked on a side, away from the substrate 1, of the second package layer 321.

In some embodiments of the present disclosure, in the case that the package structure includes the first package layer 31 and the second package layer 321, the package structure further includes a fill layer 33, and the fill layer 33 is disposed between the first package layer 31 and the second package layer 321, and is configured to fill a surface of one of the first package layer 31 and the second package layer 321 close to the substrate 1, such that the surface is flat.

Such a design is due to the fact that the surface, away from the substrate 1, of one, close to the substrate 1, of the first package layer 31 and the second package layer 321 which are packaged on a side, away from the substrate 1, of the display structure 2 is uneven, and uneven positions of the surface, away from the substrate 1, of one of the first package layer 31 and the second package layer 321 close to the substrate 1 can be filled by virtue of the fill layer 33, such that the surface of one of the first package layer 31 and the second package layer 321 close to the substrate 1 is flat. Therefore, the surface, away from the substrate 1, of one of the first package layer 31 and the second package layer 321 away from the substrate 1 is flat, and the surface of the package structure is flat.

For example, as shown in FIG. 5, when the first package layer 31 is packaged on a side, away from the substrate 1, of the display structure 2 and the second package layer 321 is stacked on a side, away from the substrate 1, of the first package layer 31, the fill layer 33 can be disposed on the surface, away from the substrate 1, of the first package layer 31, and the second package layer 321 is stacked on the sides, away from the substrate 1, of the fill layer 33 and the first package layer 31.

However, in the case that the package structure includes the first package layer 31 and the second package layer 321, the arrangement of the fill layer 33 is not limited thereto. For example, in the case that the second package layer 321 is packaged on a side, away from the substrate 1, of the display structure 2 and the first package layer 31 is stacked on a side, away from the substrate 1, of the second package layer 321, the fill layer 33 is disposed on the surface, away from the substrate 1, of the second package layer 321, and the first package layer 31 is disposed on the sides, away from the substrate 1, of the fill layer 33 and the second package layer 321.

In the case that the first package layer 31 is packaged on a side, away from the substrate 1, of the display structure 2, and the second package layer 321 is stacked on a side, away from the substrate 1, of the first package layer 31. In some embodiments, the material of the second package layer 321 includes the silicon nitride compound ($SiN_x$). In some embodiments, a thickness of the second package layer 321 is 0.6 μm. In some embodiments, the material of the first package layer 31 includes the silicon oxide compound ($SiO_x$). In some embodiments, a thickness of the first package layer 31 ranges from 50 nm to 60 nm. In some embodiments, a thickness of the fill layer 33 is 12 μm. In some embodiments, a thickness of the package structure is 12.66 μm. In some embodiments, a preparation method of the fill layer 33 includes ink jet printing (IJP).

In some embodiments of the present disclosure, the package structure further includes a third package layer 322, the third package layer 322 is packaged on the sides, away from the substrate 1, of the first package layer 31 and the second package layer 321, or close to a side of the substrate 1, or disposed between the first package layer 31 and the second package layer 321, and the third package layer 322 and the first package layer 31 and the second package layer 321 are stacked.

In this way, the entrance of the water and oxygen can be prevented by the first package layer 31, thereby improving the package reliability and the product yield. Besides, the entrance of the water and oxygen can be further prevented by the second package layer 321 stacked with the first package layer 31, thereby further improving the package reliability and the product yield. Besides, the entrance of the water and oxygen can be further prevented by the third package layer 322 stacked with the first package layer 31 and the second package layer 321, thereby further improving the package reliability and the product yield.

Figure 6:
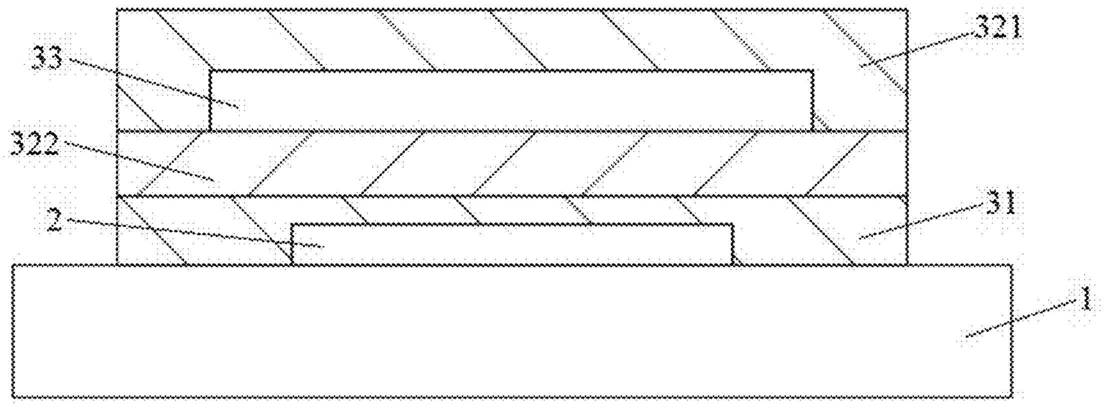
FIG. 6 is still another schematic structural diagram of a display panel according to some embodiments of the present disclosure.

For example, as shown in FIG. 6, the first package layer 31 is packaged on a side, away from the substrate 1, of the display structure 2, the third package layer 322 is stacked on a side, away from the substrate 1, of the first package layer 31, and the second package layer 321 is stacked on a side, away from the substrate 1, of the third package layer 322.

However, the arrangement of the first package layer 31, the second package layer 321 and the third package layer 322 is not limited thereto.

For example, the third package layer 322 is also packaged on a side, away from the substrate 1, of the display structure 2, the second package layer 321 is stacked on a side, away from the substrate 1, of the third package layer 322, and the first package layer 31 is stacked on a side, away from the substrate 1, of the second package layer 321.

Figure 7:
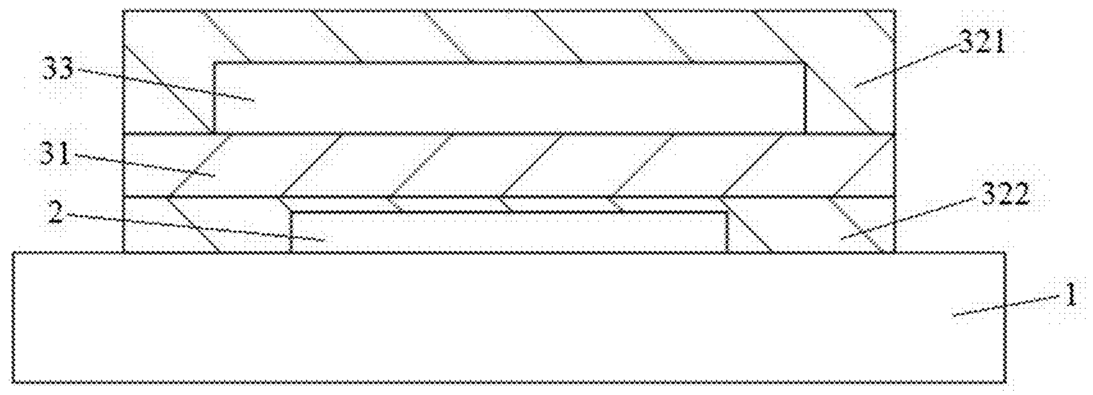
FIG. 7 is still another schematic structural diagram of a display panel according to some embodiments of the present disclosure.

For example, as shown in FIG. 7, the third package layer 322 is also packaged on a side, away from the substrate 1, of the display structure 2, the first package layer 31 is stacked on a side, away from the substrate 1, of the third package layer 322, and the second package layer 321 is stacked on a side, away from the substrate 1, of the first package layer 31.

In some embodiments of the present disclosure, in the case that the package structure includes the first package layer 31, the second package layer 321 and the third package layer 322, the package structure further include the fill layer 33, the fill layer 33 is disposed between any two adjacent layers of the first package layer 31, the second package layer 321 and the third package layer 322 for filling the surface, away from the substrate 1, of one, close to the substrate 1, of any two adjacent layers of the first package layer 31, the second package layer 321 and the third package layer 322, such that the surface is flat.

Such a design is due to the fact that the surface, away from the substrate 1, of one, close to the substrate 1, of any two adjacent layers of the first package layer 31, the second package layer 321 and the third package layer 322 which are packaged on a side, away from the substrate 1, of the display structure 2 is uneven, and the uneven positions of the surface, away from the substrate 1, of one, close to the substrate 1, of any two adjacent layers of the first package layer 31, the second package layer 321 and the third package layer 322 can be filled by the fill layer 33, such that the surface, away from the substrate 1, of one, close to the substrate, of any two adjacent layers of the first package layer 31, the second package layer 321 and the third package layer 322 is flat. Therefore, the surface, away from the substrate 1, of one, away from the substrate 1, of any two adjacent layers of the first package layer 31, the second package layer 321 and the third package layer 322 is flat, and the surface of the package structure is flat.

For example, as shown in FIG. 7, in the case that the third package layer 322 is packaged on a side, away from the substrate 1, of the display structure 2, the first package layer 31 is stacked on a side, away from the substrate 1, of the third package layer 322. In the case that the second package layer 321 is stacked on a side, away from the substrate 1, of the first package layer 31, the fill layer 33 is disposed on a side, away from the substrate 1, of the first package layer 31, and the second package layer 321 is stacked on the sides, away from the substrate 1, of the first package layer 31 and the fill layer 321. However, in this way, the arrangement of the fill layer 33 is not limited thereto. For example, the fill layer 33 is disposed on a side, away from the substrate 1, of the third package layer 322, and the first package layer 31 is stacked on the sides, away from the substrate 1, of the third package layer 322 and the fill layer 33.

For another example, when the first package layer 31 is packaged on a side, away from the substrate 1, of the display structure 2, the second package layer 321 is stacked on a side of the first package layer 31, and the third package layer 322 is stacked on a side, away from the substrate 1, of the second package layer 321 the fill layer 33 is disposed on a side, away from the substrate 1, of the first package layer 31, and the second package layer 321 is stacked on the sides, away from the substrate 1, of the first package layer 31 and the fill layer 33.

For another example, in the case that the second package layer 321 is packaged on a side, away from the substrate 1, of the display structure 2, the third package layer 322 is stacked on a side, away from the substrate 1, of the second package layer 321, and the first package layer 31 is stacked on a side, away from the substrate 1, of the third package layer 322, the fill layer 33 is disposed on a side, away from the substrate 1, of the third package layer 322, and the first package layer 31 is stacked on the sides, away from the substrate 1, of the third package layer 322 and the fill layer 33.

For another example, as shown in FIG. 6, in the case that the first package layer 31 is packaged on a side, away from the substrate 1, of the display structure 2, the third package layer 322 is stacked on a side, away from the substrate 1, of the first package layer 31, and the second package layer 321 is stacked on a side, away from the substrate 1, of the third package layer 322, the fill layer 33 is disposed on a side, away from the substrate 1, of the third package layer 322, and the second package layer 321 is stacked on the sides, away from the substrate 1, of the fill layer 33 and the third package layer 322.

For another example, in the case that the second package layer 321 is packaged on a side, away from the substrate 1, of the display structure 2, the third package layer 322 is stacked on a side, away from the substrate 1, of the second package layer 321, and the first package layer 31 is stacked on a side, away from the substrate 1, of the third package layer 322, the fill layer 33 is disposed on a side, away from the substrate 1, of the second package layer 321, and the third package layer 322 is stacked on the sides, away from the substrate 1, of the fill layer 33 and the second package layer 321.

In the case that the second package layer 321 is packaged on the sides, away from the substrate 1, of the first package layer 31 and the third package layer 322. In some embodiments, the material of the third package layer 322 includes a silicon oxide nitride compound SiON. In some embodiments, the thickness of the third package layer 322 is 1 μm. In some embodiments, the material of the second package layer 321 includes the silicon nitride compound ($SiN_x$). In some embodiments, the thickness of the second package layer 321 is 0.6 μm. In some embodiments, the material of the first package layer 31 includes the silicon oxide compound ($SiO_x$). In some embodiments, the thickness of the first package layer 31 ranges from 50 nm to 60 nm. In some embodiments, the thickness of the fill layer 33 is 12 μm. In some embodiments, the thickness of the package structure is 13.66 μm. Optionally, the preparation method of the fill layer 33 includes the ink jet printing (IJP).

As shown in FIG. 5 and FIG. 6, in some embodiments, the first package layer 31 is packaged on a side, away from the substrate 1, of the display structure 2 and a periphery of the display structure 2, that is, the package structure is packaged on a side, away from the substrate 1, of the display structure 2 and the periphery of the display structure 2.

As shown in FIG. 7, in some embodiments, the third package layer 322 is packaged on a side, away from the substrate 1, of the display structure 2 and the periphery of the display structure 2. That is, the package structure is packaged on a side, away from the substrate 1, of the display structure 2 and the periphery of the display structure 2.

In some embodiments of the present disclosure, the first package layer 31 includes a plurality of first package sub-layers, and the plurality of first package sub-layers are stacked to form the first package layer 31.

In some embodiments, a material of each of the first package sub-layers includes any one or more of the silicon nitride compound ($SiN_x$), the silicon oxide compound ($SiO_x$) and the aluminum oxide compound.

In some embodiments of the present disclosure, the thickness of the first package layer 31 ranges from 50 nm to 60 nm.

In some embodiments, the thickness of the first package layer 31 is 50 nm.

In some embodiments of the present disclosure, the thickness of the first package layer 31 accounts for 39.53% to 47.39% of a total thickness of the first package layer 31, the second package layer 321 and the fill layer 33.

For example, in the display panel shown in FIG. 5, the thickness of the first package layer 31 ranges from 50 nm to 60 nm, the thickness of the second package layer 321 is 0.6 μm, and the thickness of the fill layer 33 is 12 μm. In the case that the thickness of the first package layer 31 is 50 nm, the total thickness of the first package layer 31, the second package layer 321 and the fill layer 33 is 12.65 μm, and the thickness of the first package layer 31 accounts for 39.53% of the total thickness of the first package layer 31, the second package layer 321 and the fill layer 33. In the case that the thickness of the first package layer 31 is 60 nm, the total thickness of the first package layer 31, the second package layer 321 and the fill layer 33 is 12.66 μm, and the thickness of the first package layer 31 accounts for 47.39% of the total thickness of the first package layer 31, the second package layer 321 and the fill layer 33.

In some embodiments of the present disclosure, the thickness of the first package layer 31 accounts for 36.63% to 43.92% of a total thickness of the first package layer 31, the second package layer 321, the third package layer 322 and the fill layer 33.

For example, in the display panel shown in FIG. 6 and FIG. 7, the thickness of the first package layer 31 ranges from 50 nm to 60 nm, the thickness of the second package layer 321 is 0.6 μm, the thickness of the third package layer 322 is 1 μm, and the thickness of the fill layer 33 is 12 μm. When the thickness of the first package layer 31 is 50 nm, the total thickness of the first package layer 31, the second package layer 321, the third package layer 322 and the fill layer 33 is 13.65 μm, and the thickness of the first package layer 31 accounts for 36.63% of the total thickness of the first package layer 31, the second package layer 321 and the fill layer 33. When the thickness of the first package layer 31 is 60 nm, the total thickness of the first package layer 31, the second package layer 321 and the fill layer 33 is 12.66 μm, and the thickness of the first package layer 31 accounts for 43.92% of the total thickness of the first package layer 31, the second package layer 321 and the fill layer 33.

In some embodiments of the present disclosure, failure time of the display panel is at least 240 hours in the case that a temperature is 85° C. and a humidity is 85%.

In some embodiments of the present disclosure, the failure time of the display panel is at least 600 hours in the case that a temperature is 85° C. and a humidity is 85%.

Inventors of the present disclosure conducted a comparative test of the package reliability between the package structure of the display panel according to the embodiments of the present disclosure and a common package structure of the display panel. In the comparative test of the package reliability, the package structure of the display panel according to the embodiments of the present disclosure includes three types. The first package structure includes the first package layer 31 made of the aluminum oxide with a thickness of 50 nm, the fill layer 33 with a thickness of 8 μm, and the second package layer 321 made of the silicon nitride compound with a thickness of 600 nm, wherein the first package layer 31 is packaged on a side, away from the substrate 1, of the display structure 2, the fill layer 33 is disposed on the surface, away from the substrate 1, of the first package layer 31, and the second package layer 321 is stacked on the sides, away from the substrate 1, of the first package layer 31 and the fill layer 33.

The second package structure includes the first package layer 31 made of $SiO_2$ with a thickness of 50 nm, the fill layer 33 with a thickness of 8 μm, and the second package layer 321 made of the silicon nitride compound with a thickness of 600 nm, wherein the first package layer 31 is packaged on a side, away from the substrate 1, of the display structure 2, the fill layer 33 is disposed on the surface of the first package layer 31, and the second package layer 321 is stacked on the sides, away from the substrate 1, of the first package layer 31 and the fill layer 321.

The third package structure includes the first package layer 31 made of $SiO_2$ with a thickness of 50 nm, the fill layer 33 with a thickness of 8 μm, the third package layer 322 made of the silicon nitride compound with a thickness of 300 nm, and the second package layer 321 made of the silicon nitride compound with a thickness of 300 nm, wherein the first package layer 31 is packaged on a side, away from the substrate 1, of the display structure 2, the third package layer 322 is stacked on a side, away from the substrate 1, of the first package layer 31, the fill layer 33 is disposed on the surface, away from the substrate 1, of the third package layer 322, and the second package layer 321 is stacked on the sides, away from the substrate 1, of the third package layer 322 and the fill layer 33.

The common package structure of the display panel includes the fill layer 33 with a thickness of 8 μm, the third package layer 322 made of the silicon nitride compound with a thickness of 600 nm, and the second package layer 321 made of the silicon nitride compound with a thickness of 600 nm, wherein the third package layer 322 is packaged on a side, away from the substrate 1, of the display structure 2, the fill layer 33 is disposed on the surface, away from the substrate 1, of the third package layer 322, and the second package layers 321 is stacked on the sides, away from the substrate 1, of the third package layer 322 and the fill layer 33.

During the comparative test of the package reliability, the above three package structures and the common package structure are tested in an environment with a temperature of 85° C. and a humidity of 85%, in which the number of test samples of the common package structure and the first package structure is five, and the number of test samples of the second package structure and the third package structure is four. As a test result, for the common package structure, the test time is 504 hours, the failure rate of the package structure is 100%, and the failure time is 120 hours. For the first package structure, the test time is 1000 hours, the failure rate of the package structure is 0%, that is, there is no failure. For the second package structure, the test time is 504 hours, the failure rate of the package structure is 100%, and the failure time is 240 hours. For the third package structure, the test time is 600 hours, the failure rate of the package structure is 25%, and the failure time is 600 hours. It can be seen that although the failure rate of the second package structure is 100%, the second package structure prolonged the failure time compared with the common package structure, while the first package structure and the third package structure both reduced the failure rate compared with the common package structure, and the failure rate of the first package structure is 0% upon the test time of 1000 hours, that is, there is no failure. It can be seen that the package structure of the display panel according to the embodiments of the invention can improve the package reliability and the product yield compared with the package structure in the prior art.

Some embodiments of the present disclosure also provide a vehicle-mounted display device, and the vehicle-mounted display device may include the display panel according to the embodiment of the present disclosure.

By virtue of the display panel according to the embodiment of the present disclosure, the vehicle-mounted display device according to the embodiment of the present disclosure can improve the transmittance, package reliability and product yield.

Figure 13:
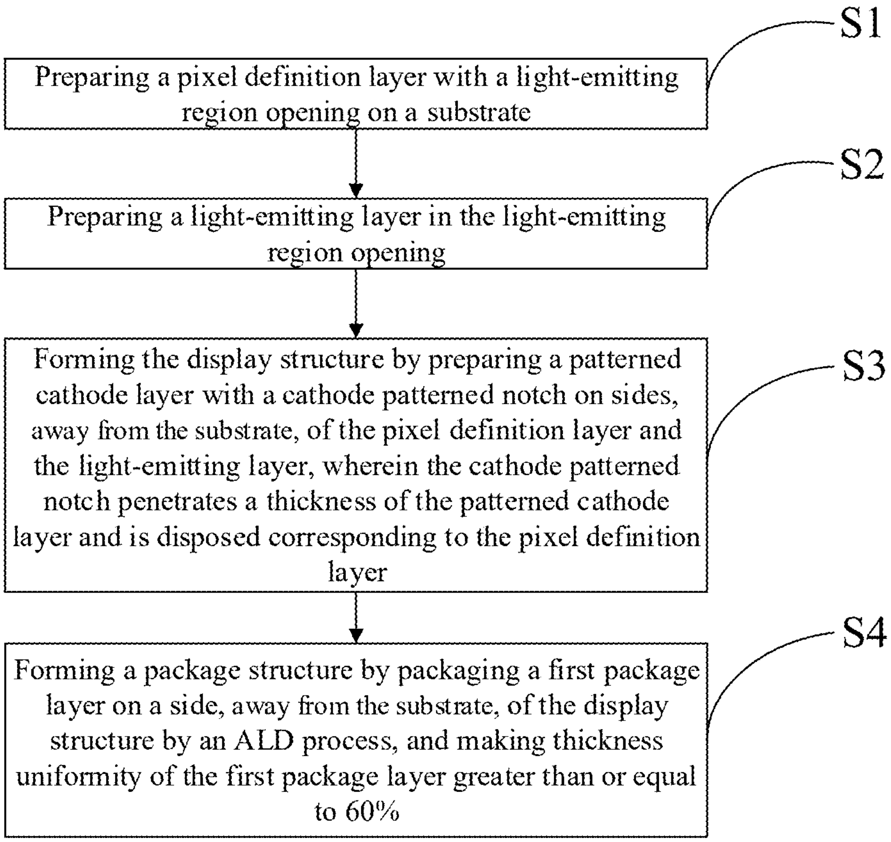
FIG. 13 is a flowchart of a method for manufacturing a display panel according to some embodiments of the present disclosure.

As shown in FIG. 13, some embodiments of the present disclosure also provide a method for manufacturing a display panel, which is applicable to manufacturing the display panel according to the embodiments of the present disclosure, and the method includes the following processes:

S1, preparing the pixel definition layer 21 with the light-emitting region opening on the substrate 1;

S2, preparing the light-emitting layer 22 in the light-emitting region opening;

S3, forming the display structure 2 by preparing the patterned cathode layer 23 with a cathode patterned notch 24 on the sides, away from the substrate 1, of the pixel definition layer 21 and the light-emitting layer 22, wherein the cathode patterned notch 24 extends through the thickness of the patterned cathode layer 23 and is disposed corresponding to the pixel definition layer 21; and S4, forming the package structure by packaging the first package layer 31 on a side, away from the substrate 1, of the display structure 2 by the ALD process, with the thickness uniformity of the first package layer 31 greater than or equal to 60%.

For the method for manufacturing a display panel according to the present disclosure, the patterned cathode layer 23 with the cathode patterned notch 23 is prepared on the sides, away from the substrate 1, of the pixel definition layer 21 and the light-emitting layer 22 of the display structure 2, and the cathode patterned notch 24 extends through the thickness of the patterned cathode layer 23 and is disposed corresponding to the pixel definition layer 21. Therefore, compared with the prior art that the cathode layer is a whole layer covering the electroluminescence layer 22 and the pixel definition layer 21, the non-light-emitting region where the pixel definition layer is disposed is not provided with the cathode layer, such that the transmittance of the display panel can be improved. Moreover, by disposing the first package layer 31 in the package structure on a side, away from the substrate 1, of the display structure 2 through the ALD process, and making the thickness uniformity of the first package layer 31 greater than or equal to 60%, because the thickness uniformity of the first package layer 31 is greater than or equal to 60%, thinner portions of the first package layer 31 which are easy for the water and oxygen to extends through can be reduced, such that the capability of preventing entrance of the water and oxygen of the package structure can be improved, the package reliability of the display panel can be further improved, and the product yield is improved.

Specifically, by step S1 in which the pixel definition layer 21 with the light-emitting region opening is prepared on the substrate 1, step S2 in which the light-emitting layer 22 is prepared in the light-emitting region opening, and step S3 in which the patterned cathode layer 23 with a cathode patterned notch 24 is prepared on the sides, away from the substrate 1, of the pixel definition layer 21 and the light-emitting layer 22, the display structure 2 can be prepared. By step S4 in which the package structure is prepared by packaging the first package layer 31 on a side, away from the substrate 1, of the display structure 2, with the thickness uniformity of the first package layer 31 greater than or equal to 60%.

In some embodiments, a process of preparing the second package layer 321 includes a chemical vapor deposition (CVD) process.

In some embodiments, a process of preparing the third package layer 322 includes the CVD process.

In practical application, the first package layer 31 prepared by the ALD process has better climbing property and filling property compared with the second package layer 321 and the third package layer 322 which are prepared by the vapor deposition process, such that the first package layer 31 has higher thickness uniformity and density compared with the second package layer 321 and the third package layer 322. Therefore, the package structure can also have higher thickness uniformity and density on a side, away from the substrate 1, of the uneven display structure 2, such that the capability of preventing entrance of the water and oxygen of the package structure can be improved, and the reliability of the package structure, the package reliability of the display panel and the product yield can be improved.

In practice, the thickness uniformity of the first package layer 31 prepared by the ALD process can reach or even exceed 95%, which meets the requirement that the thickness uniformity of the first package layer 31 is greater than or equal to 60%, while the thickness uniformity of the second package layer 321 and the third package layer 322 prepared by the vapor deposition process can reach 30% to 40%. It can be seen that the first package layer 31 prepared by the ALD process has higher thickness uniformity compared with the second package layer 321 and the third package layer 322 which are prepared by the vapor deposition process.

In summary, the display panel, the vehicle-mounted display device and the method for manufacturing a display panel according to the embodiments of the present disclosure can improve the transmittance, the package reliability and the product yield.

It can be understood that the above embodiments are only exemplary embodiments adopted for explaining principles of the present disclosure, but the present disclosure is not limited thereto. It is obvious to those ordinary skilled in the art that various variations and improvements can be made without departing from the spirit and essence of the present disclosure, and these variations and improvements are also regarded as the protection scope of the present disclosure.

The invention claimed is:

1. A display panel, comprising a substrate, a display structure and a package structure, wherein the display structure is disposed on the substrate, the package structure is packaged on a side, away from the substrate, of the display structure, wherein the display structure comprises a pixel definition layer, a light-emitting layer, and a patterned cathode layer, wherein the pixel definition layer is disposed on the substrate, a light-emitting region opening is disposed on the pixel definition layer, a portion of the light-emitting layer is disposed in the light-emitting region opening, the patterned cathode layer is disposed on sides, away from the substrate, of the pixel definition layer and the light-emitting layer, the patterned cathode layer has a cathode patterned notch, and the cathode patterned notch extends through a thickness of the patterned cathode layer and is disposed corresponding to the pixel definition layer; and the package structure comprises a first package layer, wherein the first package layer is packaged on a side, away from the substrate, of the display structure, and thickness uniformity of the first package layer is greater than or equal to 60%.

2. The display panel according to claim 1, wherein the package structure further comprises a second package layer, the second package layer is stacked with the first packing later and is packaged on a side, away from the substrate, of the display structure.

3. The display panel according to claim 2, wherein the package structure further comprises a third package layer, the third package layer is packaged on sides, away from the substrate, of the first package layer and the second package layer or sides, close to the substrate, of the first package layer and the second package layer, or is disposed between the first package layer and the second package layer, and the third package layer is stacked with the first package layer and the second package layer.

4. The display panel according to claim 3, wherein the package structure further comprises the fill layer, the fill layer is disposed between any two adjacent layers of the first package layer, the second package layer and the third package layer, and is configured to fill a surface, away from the substrate, of one of the any two adjacent layers close to the substrate, such that the surface is flat.

5. The display panel according to claim 4, wherein failure time of the display panel is at least 600 hours in the case that a temperature is 85° C. and a humidity is 85%.

6. The display panel according to claim 4, wherein a thickness of the first package layer accounts for 36.63% to 43.92% of a total thickness of the first package layer, the second package layer, the third package layer and the fill layer.

7. The display panel according to claim 2, wherein the package structure further comprises a fill layer, the fill layer is disposed between the first package layer and the second package layer, and is configured to fill a surface, away from the substrate, of one of the first package layer and the second package layer close to the substrate, such that the surface is flat.

8. The display panel according to claim 7, wherein a thickness of the first package layer accounts for 39.53% to 47.39% of a total thickness of the first package layer, the second package layer and the fill layer.

9. The display panel according to claim 1, wherein a warpage protruding toward a side away from the substrate is disposed on an edge, close to the cathode patterned notch, of the patterned cathode layer, and an orthographic projection of the first package layer on the patterned cathode layer is partially overlapped with the warpage of the patterned cathode layer.

10. The display panel according to claim 9, wherein the display structure further comprises a light extraction layer, wherein the light extraction layer is disposed on a side, away from the substrate, of the patterned cathode layer, a morphology of a portion of the light extraction layer corresponding to the warpage protrudes and/or sinks along with the warpage, and an orthographic projection of the first package layer on the light extraction layer is partially overlapped with the warpage of the light extraction layer.

11. The display panel according to claim 1, wherein material particles of the patterned cathode layer protruding toward a side away from the substrate are disposed on a side, away from the substrate, of the pixel definition layer, a morphology of a portion of the first package layer corresponding to the material particles protrudes along with the material particles, the first package layer comprises a first top package portion, a first bottom package portion and a first side package portion, the first top package portion corresponds to a side, away from the substrate, of the material particles, the first bottom package portion corresponds to a portion of a side, away from the substrate and without the material particles, of the display structure, and the first side package portion corresponds to a side slope surface of the material particles; and the thickness uniformity comprises any one or more of first thickness uniformity, second thickness uniformity and third thickness uniformity, wherein the first thickness uniformity is a percentage value of a thickness of the first side package portion to a thickness of the first top package portion, the second thickness uniformity is a percentage value of the thickness of the first side package portion to a thickness of the first bottom package portion, the third thickness uniformity is a percentage value of the thickness of the first top package portion to the thickness of the first bottom package portion, and any one or more of the first thickness uniformity, the second thickness uniformity and the third thickness uniformity is/are greater than or equal to 60%.

12. The display panel according to claim 1, wherein a warpage protruding toward a side away from the substrate and/or sinking toward a side close to the substrate is disposed on an edge, close to the cathode patterned notch, of the patterned cathode layer, a morphology of a portion of the first package layer corresponding to the warpage protrudes and/or sinks along with the warpage, the first package layer comprises a second top package portion, a second bottom package portion and a second side package portion, the second top package portion corresponds to a side, away from the substrate, of the warpage, the second bottom package portion corresponds to a portion one of a side, away from the substrate and without the warpage, of the display structure, and the second side package portion corresponds to a side slope surface of the warpage; and the thickness uniformity comprises any one or more of third thickness uniformity, fourth thickness uniformity and fifth thickness uniformity, the third thickness uniformity is a percentage value of a thickness of the second side package portion to a thickness of the second top package portion, the fourth thickness uniformity is a percentage value of the thickness of the second side package portion to a thickness of the second bottom package portion, the fifth thickness uniformity is a percentage value of the thickness of the second top package portion to the thickness of the second bottom package portion, and any one or more of the third thickness uniformity, the fourth thickness uniformity and the fifth thickness uniformity is greater than or equal to 60%.

13. The display panel according to claim 1, wherein an orthographic projection of the first package layer on the patterned cathode layer is partially overlapped with the cathode patterned notch.

14. The display panel according to claim 1, wherein a cathode patterned layer is disposed in the cathode patterned notch in a side, away from the substrate, of the pixel definition layer, a material of the cathode patterned layer is not adhered to a material of the patterned cathode layer to form the cathode patterned notch, and an orthographic projection of the first package layer on the patterned cathode layer is partially overlapped with the cathode patterned layer.

15. The display panel according to claim 1, wherein a material of the first package layer comprises any one or more of a silicon nitride compound, a silicon oxide compound, and an aluminum oxide compound.

16. The display panel according to claim 1, wherein the thickness uniformity of the first package layer is greater than or equal to 80%.

17. The display panel according to claim 1, wherein a thickness of the first package layer ranges from 50 nm to 60 nm.

18. The display panel according to claim 1, wherein failure time of the display panel is at least 240 hours in the case that a temperature is 85° C. and a humidity is 85%.

19. A method for manufacturing a display panel, applicable to manufacturing the display panel as defined in claim 1, the method comprising:

preparing the pixel definition layer with the light-emitting region opening on the substrate;

preparing the light-emitting layer in the light-emitting region opening;

forming the display structure by preparing the patterned cathode layer with the cathode patterned notch on the sides, away from the substrate, of the pixel definition layer and the light-emitting layer, wherein the cathode patterned notch extends through the thickness of the patterned cathode layer and is disposed corresponding to the pixel definition layer; and forming the package structure by packaging the first package layer on a side, away from the substrate, of the display structure by an atomic layer deposition (ALD) process, with the thickness uniformity of the first package layer greater than or equal to 60%.

20. A vehicle-mounted display device, comprising a display panel;

wherein the display panel comprises a substrate, a display structure and a package structure, wherein the display structure is disposed on the substrate, the package structure is packaged on a side, away from the substrate, of the display structure, characterized in that: the display structure comprises a pixel definition layer, a light-emitting layer and a patterned cathode layer, the pixel definition layer is disposed on the substrate, a light-emitting region opening is disposed on the pixel definition layer, a portion of the light-emitting layer is disposed in the light-emitting region opening, the patterned cathode layer is disposed on sides, away from the substrate, of the pixel definition layer and the light-emitting layer, the patterned cathode layer has a cathode patterned notch, and the cathode patterned notch extends through a thickness of the patterned cathode layer and is disposed corresponding to the pixel definition layer; and the package structure comprises a first package layer, the first package layer is packaged on a side, away from the substrate, of the display structure, and thickness uniformity of the first package layer is greater than or equal to 60%.

* * * * *